United States Patent [19]
Lu et al.

[11] Patent Number: 5,804,480
[45] Date of Patent: Sep. 8, 1998

[54] METHOD FOR FORMING A DRAM CAPACITOR USING HSG-SI TECHNIQUE AND OXYGEN IMPLANT

[75] Inventors: Chih-Yuan Lu; Horng-Huei Tseng, both of Hsinchu, Taiwan

[73] Assignee: Vanguard International Semiconductor Corporation, Hsinchu, Taiwan

[21] Appl. No.: 807,441

[22] Filed: Feb. 28, 1997

[51] Int. Cl.$^6$ .................... H01L 21/8242; H01L 21/20
[52] U.S. Cl. ..................... 438/253; 438/255; 438/398
[58] Field of Search .................... 438/238, 239, 438/253, 255, 381, 396, 398; 257/306, 309

[56] References Cited

U.S. PATENT DOCUMENTS

| | | | |
|---|---|---|---|
| 5,256,587 | 10/1993 | Jun et al. .................... | 438/398 |
| 5,302,540 | 4/1994 | Ko et al. .................... | 438/398 |

OTHER PUBLICATIONS

H. Arima, et al., "A Novel Stacked Capacitor with Dual Cell Plate for 64Mb DRAMs", *1990 IEDM*, pp. 651–654, (1990).
M. Sakao, et al., "A Capacitor–Over–Bit–Line (COB) Cell with a Hemispherical–Grain Storage Node for 64Mb DRAMs", *1990 IEDM*, pp. 655–658, (1990).
H. Watanabe, et al., "A New Cylindrical Capacitor Using Hemispherical Grained Si (HSG–Si) for 256Mb DRAMs", *1990 IEDM*, pp. 259–262, (1990).

*Primary Examiner*—Joni Chang
*Attorney, Agent, or Firm*—Christensen, O'Connor, Johnson & Kindness PLLC

[57] ABSTRACT

A method for forming a DRAM capacitor using a HSG-Si includes forming a dielectric layer over a substrate. A polysilicon layer is formed over the dielectric layer, and a hemispherical-grained silicon (HSG-Si) layer is formed on the polysilicon layer using an initial phase HSG-Si process. The HSG-Si layer includes a large number of silicon grains spaced apart on the surface of the polysilicon layer with the area of the polysilicon layer's surface being left exposed. Next, oxygen is implanted into the polysilicon layer using the silicon grains as an implant mask, thereby forming oxygen regions in the polysilicon layer. The HSG-Si layer is removed and the oxygen regions are annealed to transform the atom regions into oxide regions. Afterwards, the polysilicon layer is etched using the oxide regions as an etching mask, thereby forming a large number of trenches in the polysilicon layer. The oxide regions and portions of the polysilicon layer are removed to form a storage node, which serves as a bottom electrode of the DRAM cell capacitor.

19 Claims, 5 Drawing Sheets

METHOD FOR FORMING A DRAM CAPACITOR USING HSG-SI TECHNIQUE AND OXYGEN IMPLANT

BACKGROUND OF THE INVENTION

1. Field of the Invention

The present invention relates to dynamic random access memory (DRAM) fabrication, and more particularly to a method for forming a capacitor of a dynamic random access memory cell.

2. Description of the Prior Art

Recently, demand for semiconductor devices has rapidly increased owing to widespread use of electronic equipment. In particular, the increasing popularity of some electronic equipment such as computers, for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17 respectively receives row address 10 signals and column address 12 signals. The buffers 15 and 17 then drive these signals to a row decoder 16 and column decoder 18, respectively. The row decoder 16 and the column decoder 18 then respectively select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in the "very large scale integration" (VLSI) industry. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor is disclosed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the capacitor's capacitance while maintaining the small area occupied on the substrate surface. Consequently, this type of capacitor has come to be widely used in DRAM devices.

Another consideration in achieving high density memory devices is the limitations of lithography techniques widely used in the semiconductor industry. The so-called "minimum feature size" (i.e., the minimum line-width, contact dimensions, or line-to-line separation that can be formed on the substrate surface) of the photolithographic process limits the number of circuits that can be fabricated on the wafer. The minimum feature size is largely determined by the resolution of an optical imaging system used in the photolithography process. The minimum feature size can be reduced, but typically at the cost of further reducing the depth of focus and restricting the flexibility in the design of three-dimensional structures. Accordingly, there is a need for a method of forming a DRAM capacitor with features that are smaller than the minimum feature size of the photolithographic process while increasing the surface area of the capacitor electrodes.

SUMMARY OF THE INVENTION

In accordance with the present invention, a method is provided for forming a DRAM capacitor that substantially increases the surface area of the capacitor's electrodes to increase the capacitance of the capacitor. In one embodiment, an oxide layer is formed over a substrate, and a first photoresist layer is formed and patterned on the oxide layer to define a contact area over a portion of the substrate surface. A portion of the oxide layer is removed to form a first trench exposing a portion of the substrate surface defined by the first photoresist layer. Next, a doped polysilicon layer is formed over the oxide layer and filling the first trench. Subsequently, a hemispherical-grained silicon (HSG-Si) layer is formed on the polysilicon layer, where the HSG-Si layer includes a large number of silicon grains spaced apart, thereby exposing portions of the doped polysilicon layer between the silicon grains. In this embodiment, the nominal silicon grain diameter and the nominal spacing between the silicon grains is less than the minimum feature size achieved by standard photolithography techniques. Oxygen atoms are then implanted into the doped polysilicon layer using the silicon grains as a mask, thereby forming a large number of oxygen regions in the polysilicon layer between the silicon grains. The silicon grains are then removed to expose the portions of the polysilicon layer covered by the silicon grains. Afterwards, an annealing process is performed, transforming the oxygen regions into silicon oxide regions. Subsequently, portions of the doped polysilicon layer between the silicon oxide regions are removed, thereby forming a large number of second trenches in the polysilicon layer. These second trenches advantageously increase the surface area of doped polysilicon layer.

Moreover, because of the subs-minimal dimensions of the silicon grains and spacing, the increase in surface area is significantly larger than can be achieved using standard photolithography techniques to form the second trenches. The silicon oxide regions are then removed and a second photoresist layer is formed and patterned on the doped polysilicon layer to define a storage node over a portion of the doped polysilicon layer. Finally, portions of the polysilicon layer left uncovered by the second photoresist layer are removed to form a storage node, which serves as a bottom electrode of the capacitor of a DRAM cell.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
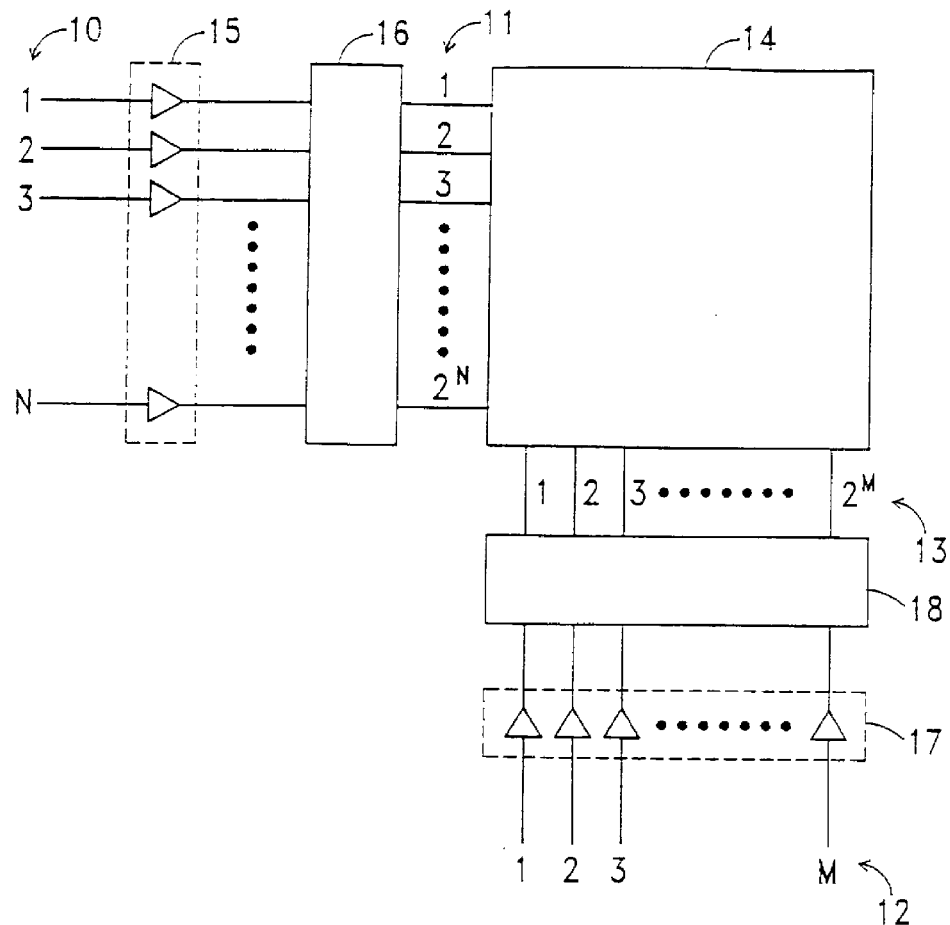
FIG. 1 shows a simplified diagram of the organization of large semiconductor memories.
Figure 2A:
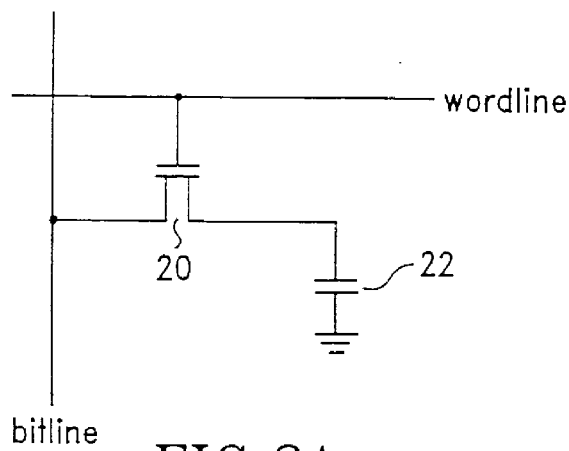
FIG. 2A shows a circuit schematic diagram of a dynamic random access memory (DRAM)
Figure 2B:
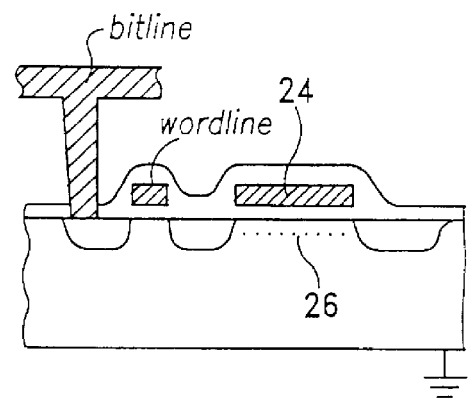
FIG. 2B shows a cross sectional view illustrative of a traditional one-transistor DRAM storage cell.
Figure 3:
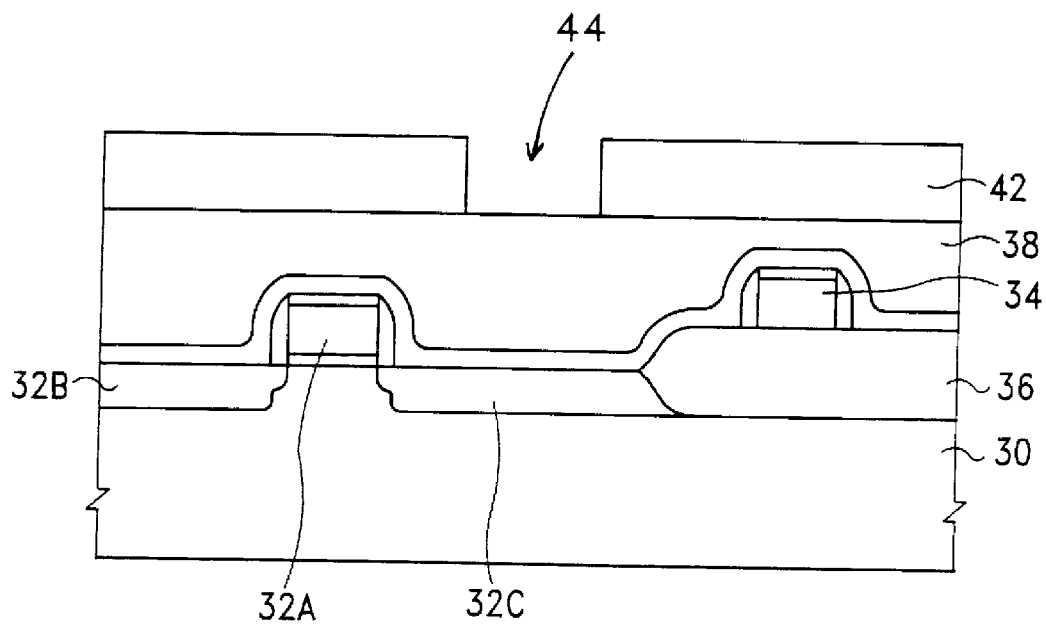
FIGS. 3 to 10 show cross-sectional views illustrative of various stages in the fabrication of a DRAM capacitor in accordance with one embodiment of the present invention.

Referring to FIG. 3, a metal-oxide-semiconductor field effect transistor (MOSFET) having a gate 32A, a drain 32B and a source 32C, is conventionally formed in and on the substrate 30. In addition, a field oxide (FOX) region 36 is conventionally formed in the substrate 30 adjacent to the source 32C. A word line 34 is formed on the FOX region 36. Typically, the word line 34 is made of doped polysilicon. In this embodiment, the MOSFET is a n-channel MOSFET that forms part of a dynamic random access memory (DRAM) cell. A dielectric layer such as an oxide layer 38 is formed over the MOSFET and on the substrate 30 using a chemical vapor deposition (CVD) method, typically to a thickness of about 3000 to 8000 angstroms. This oxide layer 38 can be an undoped oxide, doped oxide or combination thereof. The oxide layer 38 is then planarized by a conventional planarization method such as, for example, chemical mechanical polishing (CMP) to reduce the topography and aid in subsequent photolithography processes. Afterwards, conventional photolithography techniques are used to define a storage node contact area in a photoresist layer 42 formed on the oxide layer 38. The photoresist layer 42 is patterned to expose a portion of the oxide layer 38 over the source 32C. In order to fabricate a high density DRAM, the width of the exposed portion of the oxide layer 38 is chosen at or near the minimum feature size of the photolithography technique. In other embodiments, the storage node contact can be fabricated using other suitable techniques.

Using the photoresist layer 42 as an etching mask, the oxide layer 38 is anisotropically etched. In this embodiment, magnetic enhanced reactive ion etch (MERIE) is used to etch the oxide. A node trench 44 is thus formed in the oxide layer 38 as shown in FIG. 4, exposing a portion of the source region 32C.

Figure 4:
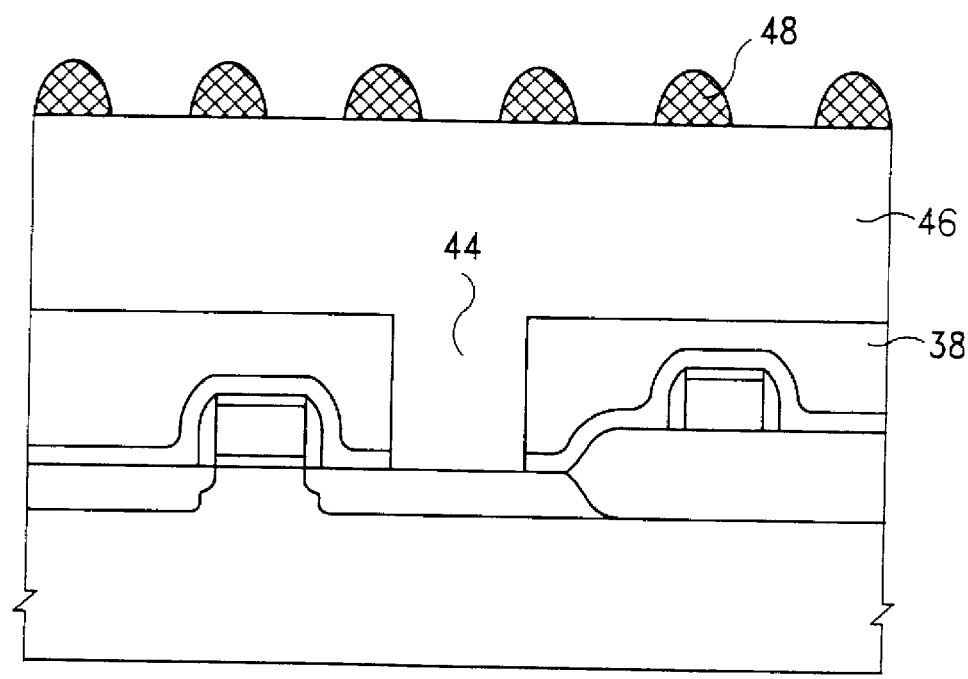

A relatively thick doped polysilicon layer 46, shown in FIG. 4, is formed over the oxide layer 38 so as to fill the trench 44. The nominal thickness of the doped polysilicon layer 46 above the oxide layer 38 is about 2000 to 5000 angstroms. Typically, the polysilicon layer 46 is doped with phosphorus dopants at a concentration of about 1E20~1E21 atoms/cm$^3$ to increase conductivity.

Afterwards, an undoped or doped hemispherical-grained silicon (HSG-Si) layer 48 is formed on the polysilicon layer 46 using a HSG-Si process referred to as "initial phase HSG-Si". In this embodiment, the nominal diameter of the grain is about 50~500 angstroms, and the nominal distance between the adjacent grains is about 100~1000 angstroms. The HSG-Si layer 48 can be alternatively formed by addition of two process steps, i.e., HSG polysilicon deposition and an etchback. The HSG polysilicon is deposited by low pressure chemical vapor deposition (LPCVD) with He-diluted $SiH_4$ (20%) gas at 1.0 torr pressure at a temperature of about 550° C. Thereafter, the HSG-Si is etchbacked by reactive ion etching using HBr gas without any etching mask.

Figure 5:
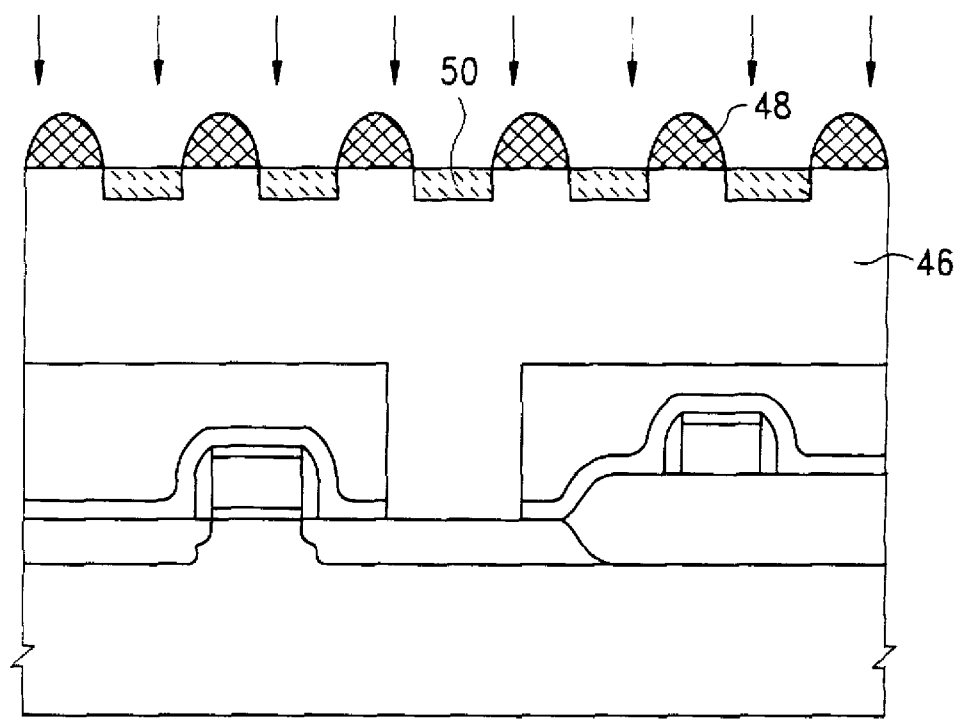

Referring to FIG. 5, atoms such as oxygen ($O_2$) atoms are implanted into the polysilicon layer 46 using the HSG-Si 48 as an implant mask, thus forming oxygen regions 50 as shown in the diagram.

Figure 6:
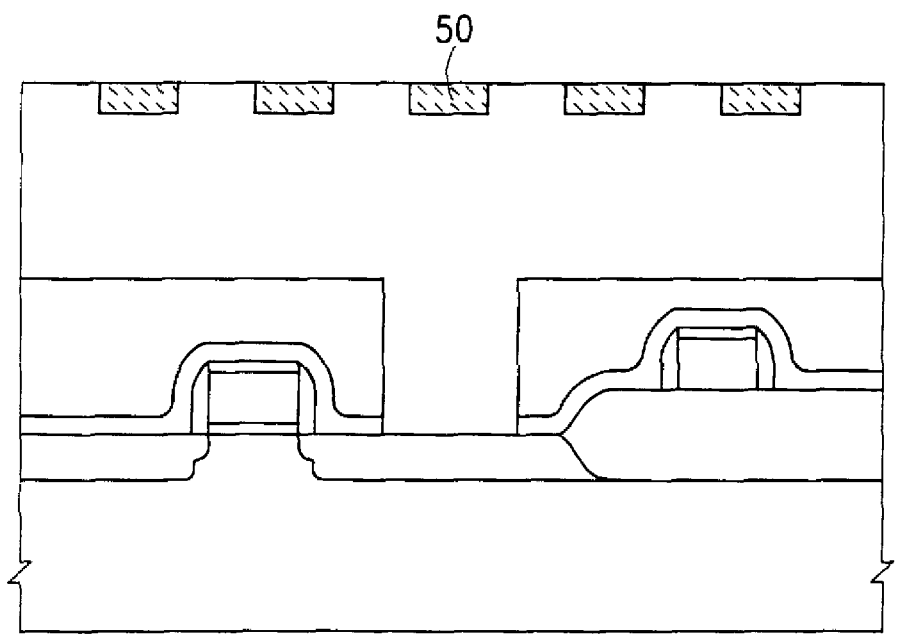
Figure 7:
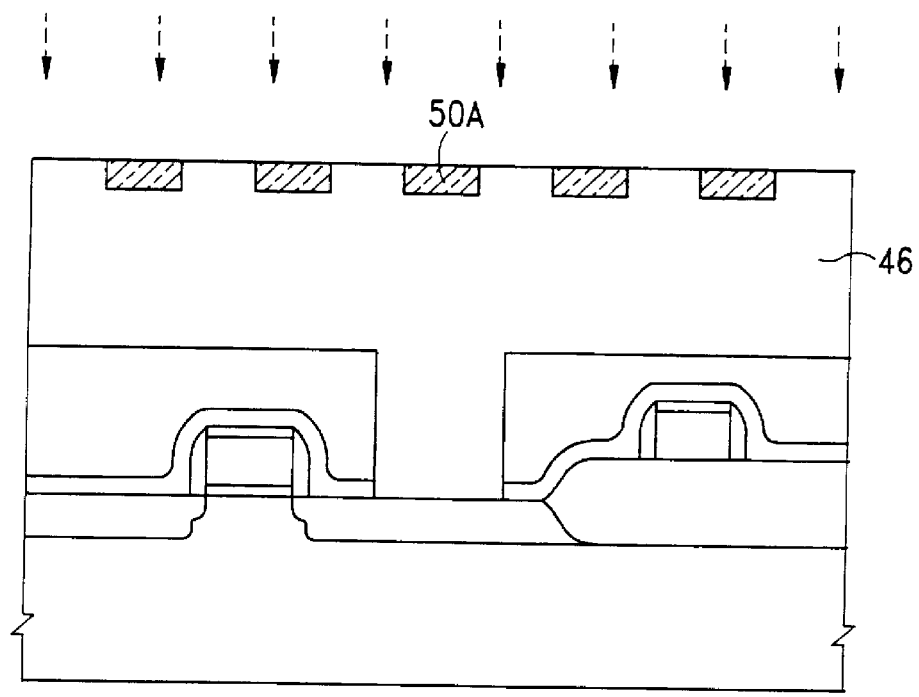

Next, the HSG-Si 48 is removed, for example, by a conventional chemical-mechanical polishing (CMP) process, resulting in the structure shown in FIG. 6. This structure is then subjected to an thermal annealing process to transform these oxygen regions 50 into silicon oxide regions 50A. The thermal annealing process can be performed in a traditional furnace or rapid thermal processing (RTP) equipment. These silicon oxide regions 50A are later used as an etch mask in a succeeding step as described below. It will be appreciated by those skilled in the art of DRAM fabrication that the HSG-Si layer 48 can be removed after the annealing step without affecting the overall process.

Figure 8:
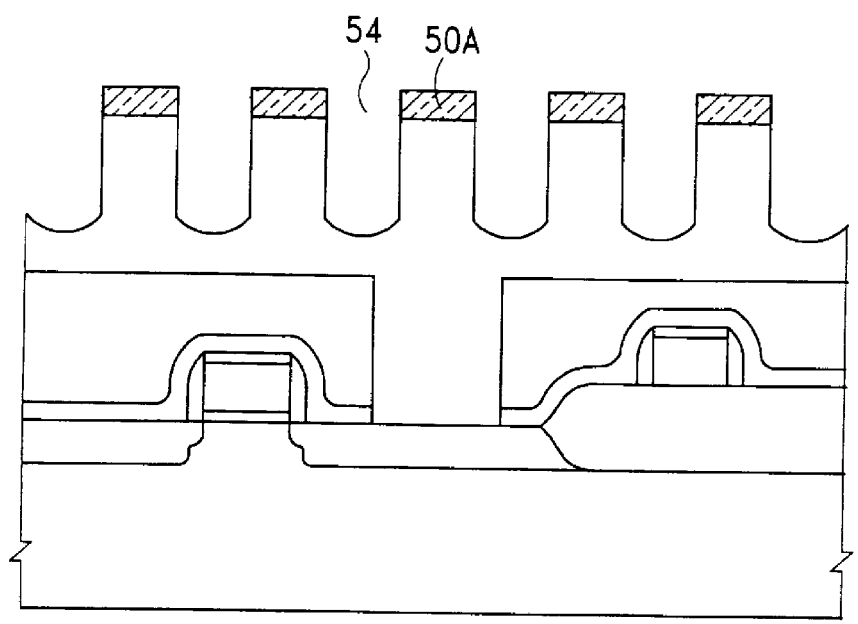

Using the silicon oxide regions 50A as an etch mask, the polysilicon layer 46 is then etched to a depth of about 1000~4000 angstroms. A large number of trenches 54 are thus formed in the polysilicon layer 46 as shown in FIG. 8. The width of these trenches 54 is about the same size as the diameter of the HSG-Si grains and, thus, is smaller than the minimum feature size achievable using standard photolithography techniques. In this embodiment, a chemical dry etch (CDE) method is performed with a fluorine etchant. In an alternative embodiment, another etching method, such as reactive ion etch (RIE) can be used to form the trenches 54. For example, in the RIE embodiment, etchants, such as $SF_6/O_2/Cl_2/HBr$ can be used. When an RIE method is used, the trenches 54 will have squared bottoms instead of rounded bottoms as is formed when a CDE method is used. However, this small difference in shape of the bottom of the trenches 54 has only a minor effect on the resultant memory capacitor.

Figure 9:
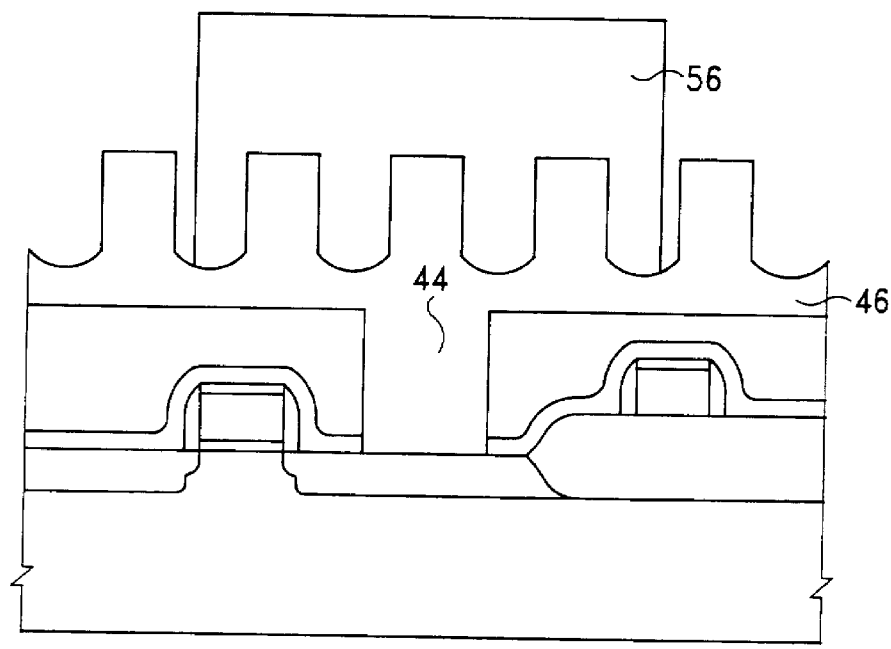

The silicon oxide regions 50A are then removed, resulting in the structure shown in FIG. 9. In this embodiment, a HF wet etch method is performed to etch the silicon oxide regions 50A using the polysilicon layer 46 as an etch stop. Next, conventional photolithography techniques are used to form and pattern a photoresist layer 56 on the polysilicon layer 46. This photoresist layer 56 is patterned to form a storage node over the polysilicon layer. In order to fabricate a high density transistor, the width of the storage node in the photoresist layer 56 is at or near the minimum feature size. The exposed portion of the polysilicon layer 46 is preferably aligned with the trench 44.

Figure 10:
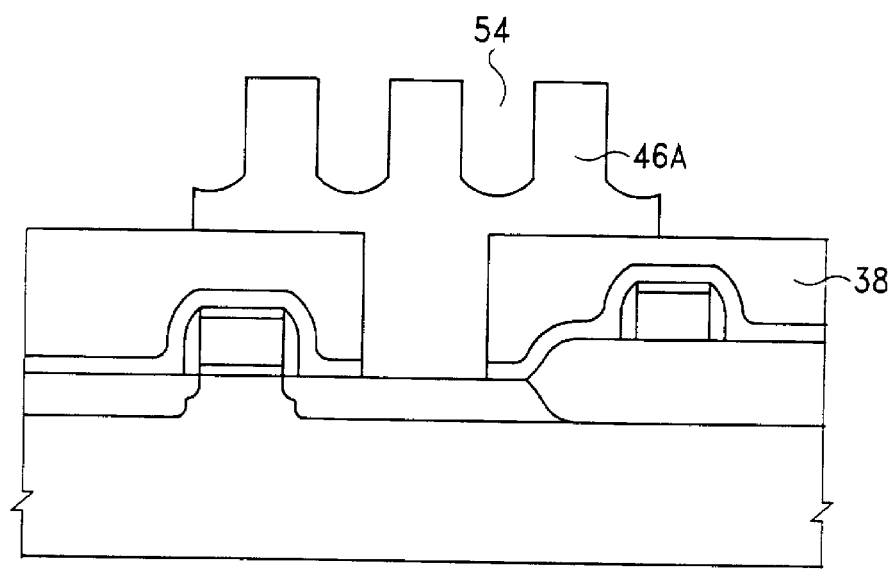

Afterwards, the polysilicon layer 46 is then etched using the photoresist layer 56 as a mask. A MERIE plasma method is preferably used with the oxide layer 38 as an etch stop in this embodiment. FIG. 10 shows the resulting storage node 46A, which serves as a bottom electrode of the DRAM cell capacitor. The bottom electrode includes sub-minimum feature size trenches 54. The trenches increase the surface area of the electrode, which increases the capacitance of the capacitor. The rest of the capacitor is formed in a conventional manner.

Although specific embodiments have been illustrated and described, it will be obvious to those skilled in the art that various modifications may be made without departing from the spirit which is intended to be limited solely by the appended claims.

What is claimed is:

1. A method for forming a capacitor of a dynamic random access memory cell, the method comprising:

forming a dielectric layer over a substrate;

forming and patterning a first photoresist layer on the dielectric layer, said first photoresist layer defining a contact area over a portion of a substrate surface;

removing a portion of the dielectric layer left uncovered by the first photoresist layer to form a first trench exposing said portion of the substrate surface;

forming a polysilicon layer over the dielectric layer, wherein said first trench in the dielectric layer is filled by the polysilicon layer;

forming a hemispherical-grained silicon (HSG-Si) layer on the polysilicon layer, said HSG-Si layer comprising a plurality of silicon grains spaced apart, wherein portions of the polysilicon layer between said plurality of silicon grains are uncovered by the HSG-Si layer;

implanting particles into said portions of the polysilicon layer not covered by said plurality of silicon grains, thereby forming a plurality of particle regions in the polysilicon layer;

removing said HSG-Si layer, thereby exposing portions of the polysilicon layer that were covered by said plurality of silicon grains;

annealing said plurality of particle regions, wherein said implanted particles react with said polysilicon layer to form a dielectric material, thereby transforming the plurality of particle regions into a plurality of dielectric regions;

removing portions of the polysilicon layer not covered by said plurality of dielectric regions, thereby forming a plurality of second trenches in the polysilicon layer;

removing said plurality of dielectric regions;

forming and patterning a second photoresist layer on the polysilicon layer, said second photoresist layer defining a storage node over a portion of said polysilicon layer, said second photoresist layer covering the first trench; and removing portions of the polysilicon layer uncovered by said second photoresist layer to form a storage node, said storage node serving as a bottom electrode of the capacitor of the dynamic random access memory cell.

2. The method according to claim 1, wherein said substrate includes a metal-oxide-semiconductor transistor formed in and on the substrate, said metal-oxide-semiconductor transistor being a part of the dynamic random access memory cell.

3. The method according to claim 1, wherein said dielectric layer comprises silicon oxide.

4. The method according to claim 1, wherein said plurality of silicon grains each have a diameter of about 50–500 angstroms and a spacing between adjacent silicon grains of about 100–1000 angstroms.

5. The method according to claim 1, wherein said HSG-Si layer is removed by a chemical-mechanical polishing method.

6. The method according to claim 1, wherein the plurality of second trenches is formed by etching said polysilicon layer using a chemical dry etch method.

7. The method according to claim 1, wherein the plurality of second trenches is formed by etching said polysilicon layer using an reactive ion etch method.

8. The method according to claim 1, wherein said particles comprise oxygen atoms.

9. The method according to claim 1, wherein said polysilicon layer comprises doped polysilicon.

10. The method according to claim 1, wherein said HSG-Si layer is removed after annealing the plurality of particle regions.

11. A method for forming a capacitor of a dynamic random access memory cell, said method comprising:

forming an oxide layer over a substrate;

forming and patterning a first photoresist layer over the oxide layer, said first photoresist layer defining a contact area over a portion of a surface of the substrate;

removing a portion of the oxide layer uncover by the first photoresist layer to form a first trench exposing said portion of the substrate surface;

forming a doped polysilicon layer over the oxide layer, wherein said first trench in the oxide layer is filled by the doped polysilicon layer;

forming a hemispherical-grained silicon (HSG-Si) layer on the doped polysilicon layer, said HSG-Si layer comprising a plurality of silicon grains spaced apart, wherein portions of the doped polysilicon layer between each silicon grain of the plurality of silicon grains is not covered by the HSG-Si layer;

implanting oxygen particles into said portions of the doped polysilicon layer not covered by the plurality of silicon grains, thereby forming a plurality of oxygen regions in the doped polysilicon layer between silicon grains of the plurality of silicon grains;

removing said HSG-Si layer, thereby exposing portions of the doped polysilicon layer that were covered by the plurality of silicon grains;

annealing said plurality of oxygen regions, thereby forming a plurality of silicon oxide regions in the doped polysilicon layer;

removing said portions of the doped polysilicon layer not covered by said plurality of silicon oxide regions, thereby forming a plurality of second trenches in the doped polysilicon layer;

removing said plurality of silicon oxide regions;

forming and patterning a second photoresist layer on the doped polysilicon layer, said second photoresist layer defining a storage node over a portion of said doped polysilicon layer, said second photoresist layer covering the first trench; and removing portions of the doped polysilicon layer not covered by the second photoresist layer to form a storage node, said storage node serving as a bottom electrode of the capacitor of the dynamic random access memory cell.

12. The method according to claim 11, wherein said substrate includes a metal-oxide-semiconductor transistor formed in and on the substrate, said metal-oxidesemiconductor transistor being a part of the dynamic random access memory cell.

13. The method according to claim 11, wherein said each silicon grain of the plurality of silicon grains has a diameter of about 50~500 angstroms and a spacing between adjacent silicon grains of about 100~1000 angstroms.

14. The method according to claim 11, wherein said HSG-Si layer is removed by a chemical-mechanical polish method.

15. The method according to claim 11, wherein the plurality of second trenches is formed by etching the doped polysilicon layer using a chemical dry etch method.

16. The method according to claim 11, wherein the plurality of second trenches is formed by etching the doped polysilicon layer using a reactive ion etch method.

17. The method according to claim 11, wherein said HSG-Si layer is removed after annealing said oxygen regions.

18. A method for forming an integrated circuit capacitor, the method comprising:

forming an oxide layer over a substrate;

forming a doped polysilicon layer over the oxide layer;

forming a hemispherical-grained silicon (HSG-Si) layer on the doped polysilicon layer, said HSG-Si layer comprising a plurality of spaced apart silicon grains, wherein portions of the doped polysilicon layer between each silicon grain of the plurality of silicon grains is not covered by the HSG-Si layer;

implanting oxygen into said portions of the doped polysilicon layer not covered by the plurality of silicon grains, thereby forming a plurality of oxygen regions in the doped polysilicon layer between silicon grains of the plurality of silicon grains;

removing said HSG-Si layer, thereby exposing portions of the doped polysilicon layer that were covered by the plurality of silicon grains;

annealing said plurality of oxygen regions, thereby forming a plurality of oxide regions in the doped polysilicon layer;

removing portions of the doped polysilicon layer not covered by said plurality of oxide regions, thereby forming a plurality of trenches in the doped polysilicon layer, wherein the plurality of trenches causes said doped polysilicon layer to have an increased surface area;

removing said plurality of oxide regions; and removing portions of the doped polysilicon layer to form a doped polysilicon structure serving as a bottom electrode of the integrated circuit capacitor.

19. The method of claim 18 wherein the HSG-Si layer is formed using an initial phase HSG-Si process.

* * * * *